United States Patent
Moon et al.

(10) Patent No.: US 10,134,992 B2
(45) Date of Patent: Nov. 20, 2018

(54) METHOD FOR MANUFACTURING ELECTRONIC ELEMENT INCLUDING TRANSPARENT CONDUCTIVE STRUCTURE

(71) Applicant: Electronics and Telecommunications Research Institute, Daejeon (KR)

(72) Inventors: Jaehyun Moon, Daejeon (KR); Jong Tae Lim, Seoul (KR); Young Sam Park, Daejeon (KR); Jin Wook Shin, Daejeon (KR); Byoung Gon Yu, Chungcheongbuk-do (KR); Hyunkoo Lee, Daejeon (KR); Jong Chan Jeong, Daejeon (KR); Nam Sung Cho, Daejeon (KR); Doo-Hee Cho, Daejeon (KR); Jun-Han Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/596,659

(22) Filed: May 16, 2017

(65) Prior Publication Data

US 2018/0047905 A1 Feb. 15, 2018

(30) Foreign Application Priority Data

Aug. 11, 2016 (KR) .................... 10-2016-0102586

(51) Int. Cl.
*H01L 51/00* (2006.01)
*H01L 51/52* (2006.01)

(52) U.S. Cl.
CPC ...... *H01L 51/0021* (2013.01); *H01L 51/5215* (2013.01); *H01L 51/5234* (2013.01)

(58) Field of Classification Search
None
See application file for complete search history.

(56) References Cited

U.S. PATENT DOCUMENTS

| 6,812,637 B2 | 11/2004 | Cok et al. |
| 9,299,483 B2 | 3/2016 | Chung et al. |

(Continued)

FOREIGN PATENT DOCUMENTS

| KR | 10-2011-0094429 A | 8/2011 |
| KR | 10-2012-0021453 A | 3/2012 |

(Continued)

OTHER PUBLICATIONS

Matthew N. Martin et al., "Charged Gold Nanoparticles in Non-Polar Solvents: 10-min Synthesis and 2D Self-Assembly", Langmuir 2010, 26(10), pp. 7410-7417, Apr. 14, 2010.

*Primary Examiner* — Eduardo A Rodela
*Assistant Examiner* — Nilufa Rahim
(74) *Attorney, Agent, or Firm* — Rabin & Berdo, P.C.

(57) ABSTRACT

Provided is a method for manufacturing an electronic device including a transparent conductive structure, the method including preparing a transparent electrode in which, among a first region and a second region, the first region is selectively surface-modified, preparing a mixed composition including a first composition and a second composition having a different polarity from the first composition, and applying the mixed composition onto the transparent electrode, wherein the applied mixed composition is disposed in the surface modified first region, and the mixed composition disposed in the first region is phase-separated into a first composition layer and a second composition layer disposed on the first composition layer.

13 Claims, 9 Drawing Sheets

(56) References Cited

U.S. PATENT DOCUMENTS

| | | | |
|---|---|---|---|
| 2011/0115367 A1* | 5/2011 | Cho | H01L 51/5275 313/504 |
| 2013/0118786 A1* | 5/2013 | Chung | H01B 1/02 174/257 |
| 2013/0126796 A1* | 5/2013 | Chung | H01B 1/08 252/512 |
| 2014/0144501 A1 | 5/2014 | Jung et al. | |
| 2016/0064693 A1 | 3/2016 | Moon et al. | |

FOREIGN PATENT DOCUMENTS

| KR | 10-2014-0068310 A | 6/2014 |
|---|---|---|
| KR | 10-2016-0025681 A | 3/2016 |

\* cited by examiner

METHOD FOR MANUFACTURING ELECTRONIC ELEMENT INCLUDING TRANSPARENT CONDUCTIVE STRUCTURE

CROSS-REFERENCE TO RELATED APPLICATIONS

This U.S. non-provisional patent application claims priority under 35 U.S.C. § 119 of Korean Patent Application No. 10-2016-0102586, filed on Aug. 11, 2016, the entire contents of which are hereby incorporated by reference.

BACKGROUND

The present disclosure herein relates to a method for manufacturing an electronic element including a transparent conductive structure, and more particularly, to a method for forming a conductive layer and an insulating layer on a transparent electrode.

Organic light emitting elements are elements that electrically excite and thereby induce self-light emission in organic compounds. Such organic light emitting elements do not require a backlight, and thus may be lightweight and achieve fast response times and high color regeneration. Thus, such organic light emitting elements have been developed and utilized in various display devices. For self light emission, the organic light emitting elements include an organic light emitting layer and an anode electrode and a cathode electrode formed above and below the organic light emitting layer. Holes supplied from the anode electrode and electrons supplied from the cathode electrode are combined in the organic light emitting layer formed between the two electrodes. Next, excitons—electron-hole pairs—are formed in the organic light emitting layer, and the energy generated as the excitons return to the ground state causes the self light emission to occur. To allow the light source generated on the organic light emitting to be externally discharged from the element, at least one of the anode electrode or the cathode electrode may be a transparent electrode having optical transmittance. It is desirable for the transparent electrode to be highly transparent and have high electrical conductivity in order to ensure that the light emitted from the organic light emitting layer is uniformly bright. Recently, various recent projects have been pursued for improving the electrical conductivity and optical transmittance of transparent electrodes.

SUMMARY

The present disclosure provides a method for forming a conductive layer and an insulating layer on a transparent electrode using a more simplified process.

An embodiment of the inventive concept provides a method for manufacturing an electronic device including a transparent conductive structure, the method including preparing a transparent electrode in which, among a first region and a second region, the first region is selectively surface-modified; preparing a mixed composition including a first composition and a second composition having a different polarity from the first composition; and applying the mixed composition onto the transparent electrode.

In an embodiment, the applied mixed composition may be disposed in the surface modified first region, and the mixed composition disposed in the first region may be phase-separated into a first composition layer and a second composition layer disposed on the first composition layer.

In an embodiment, the preparation of the transparent electrode may include placing on the transparent electrode a mask having an opening formed therein, the mask being placed so as to cover the second region; and forming the first region by modifying the surface of the transparent electrode exposed by the mask In an embodiment, the modification of the surface of the transparent electrode may include at least one of a plasma treatment, an ozone treatment, irradiation with ultraviolet radiation, or a self assembled monolayer (SAM) technique.

In an embodiment, the modification of the surface of the transparent electrode may include performing a plasma treatment using a surface modifying agent, the surface modifying agent including at least one of nitrogen, oxygen, an inert gas, carbon dioxide, nitrogen oxide, hydrogen, ammonia, a chlorine-based gas, ozone, helium, argon, neon, xenon, a perfluorinated gas, or a mixture thereof.

In an embodiment, the first region may have a higher surface energy than the second region.

In an embodiment, the first region may have a higher degree of wetting with the first composition than with the second composition.

In an embodiment, the mixed composition may be a physical mixture of the first composition and the second composition In an embodiment, the first composition may include a conductive material and a first solvent; and the second composition may include an insulating material and a second solvent.

In an embodiment, the conductive material may have the form of at least one of a nanowire, a nanorod, a nanosphere, or a nanoring.

In an embodiment, the first solvent and the second solvent may have different polarities from each other.

In an embodiment, the phase separation may further include at least one of a heat treatment method or a UV exposure method after the application of the mixed composition.

In an embodiment, curing the phase-separated first and second composition layers may be included.

In an embodiment, forming an organic light emitting layer on a face of the transparent electrode; and forming an additional electrode on the organic light emitting layer may be further included, wherein the organic light emitting layer is positioned between the transparent electrode and the additional electrode.

DETAILED DESCRIPTION

Figure 1:
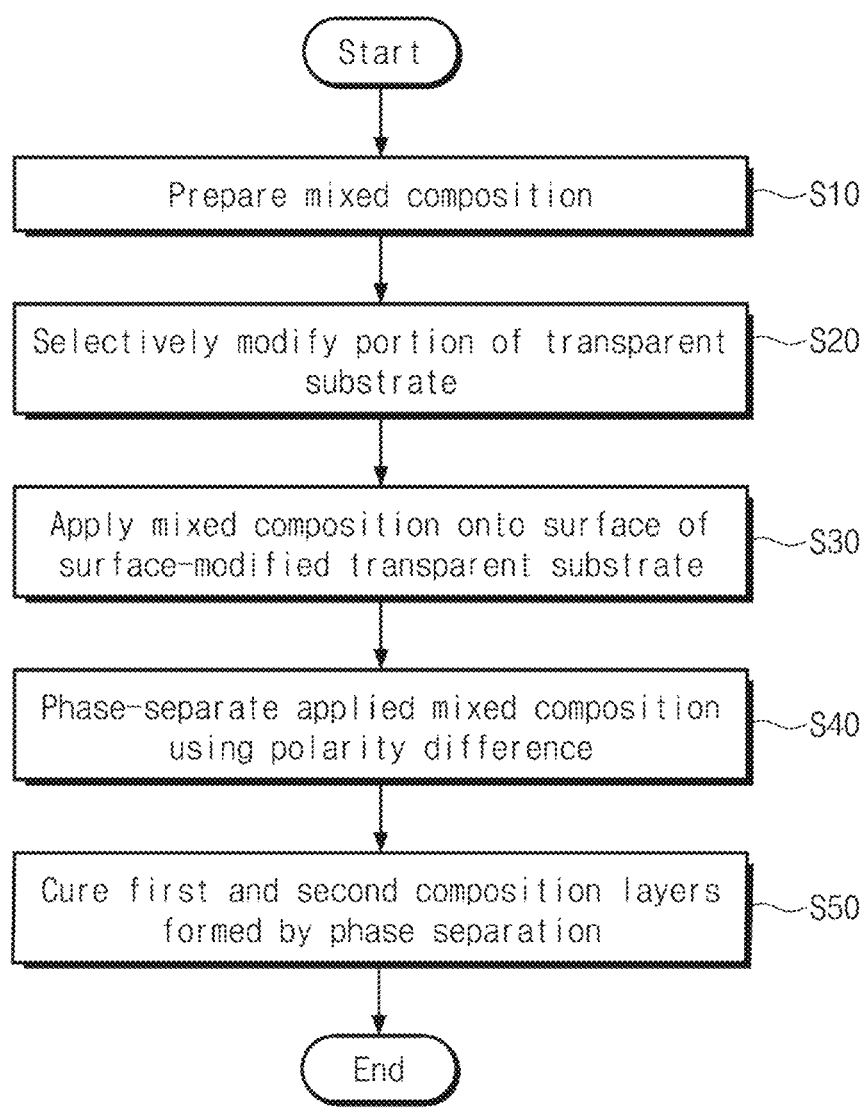
FIG. 1 is a flow chart illustrating a method for manufacturing an electronic element including a transparent electrode structure according to an embodiment of the inventive concept.

Advantages and features of the present invention, as well as methods for achieving them will be made clear with reference to the accompanying drawings and the embodiments described in detail below. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Therefore, the inventive concept is solely defined by the scope of the claims. Like reference numerals refer to like elements throughout.

The terms used herein are for describing embodiments and are not intended to limit the scope of the present invention. In the specification, singular forms are intended to include the plural forms as well, unless the context clearly indicates otherwise. The terms 'comprises' and/or 'comprising', when used in this specification, specify the presence of stated elements, steps, regions, and materials, but do not preclude the presence or addition of one or more other elements, steps, regions, and materials.

In addition, the embodiments provided herein are described with reference to idealized, exemplary cross-sectional views and/or plan views. In the drawings, the thicknesses of films and regions are exaggerated for effective description of the technical contents. Thus, the form of the exemplary diagrams may be modified due to manufacturing techniques and/or allowable tolerances and the like. Thus, embodiments of the present invention are not limited to specific illustrated forms but include modifications in shape resulting from the manufacturing process. For example, compositions and composition layer regions illustrated as being right-angled may be rounded or have defined curvatures. Therefore, exemplary regions indicated in the drawings are schematic in nature, and the shapes of the exemplary regions are for illustrating particular forms of the compositions and composition layer regions, and are not intended to limit the scope of the invention.

Figure 2:
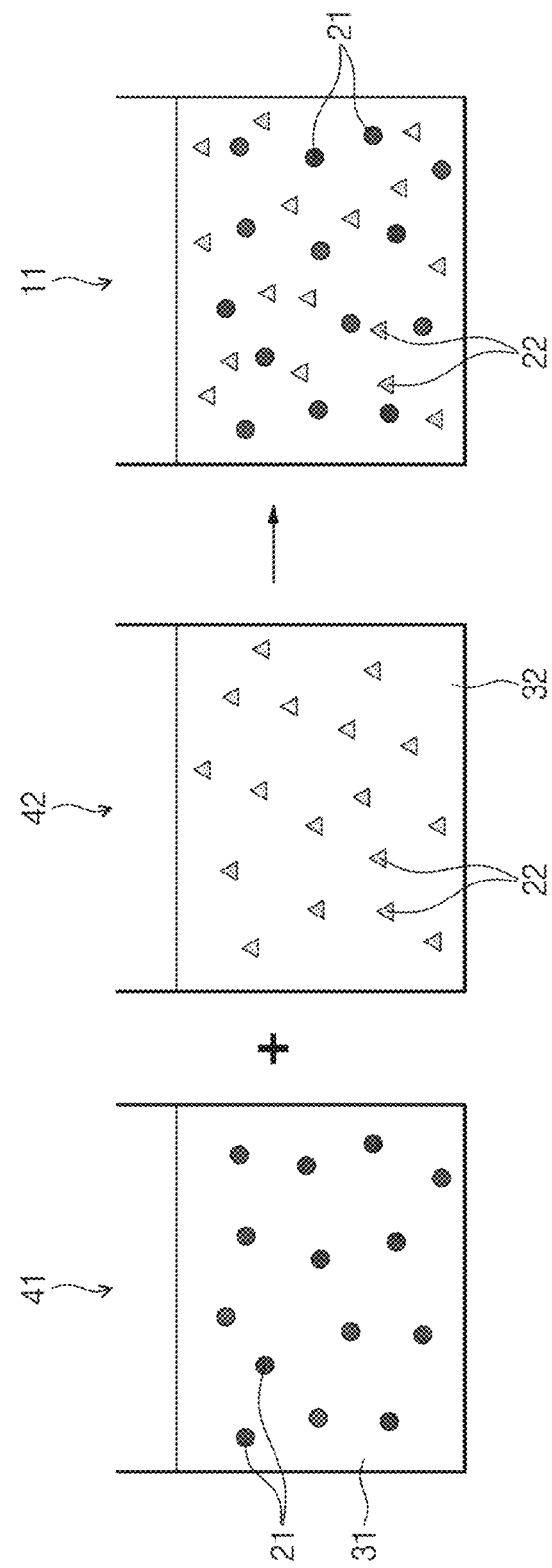
FIG. 2 is a schematic diagram for illustrating a preparation method for a mixed composition according to an embodiment of the inventive concept.

FIG. 1 is a flow chart illustrating a method for manufacturing an electronic element including a transparent conductive structure according to an embodiment of the inventive concept. FIG. 2 is a schematic diagram for illustrating a preparation method for a mixed composition according to an embodiment of the inventive concept.

Referring to FIGS. 1 and 2, a mixed composition 11 may be prepared S10. The mixed composition 11 may be prepared by mixing a first composition 41 with a second composition 42. The first composition 41 may be prepared by dissolving or dispersing a conductive material 21 in a first solvent 31. The second composition 42 may be prepared by dissolving or dispersing an insulating material 22 in a second solvent 32.

Specifically, a method for mixing the first composition 41 with the second composition 42 may be a physical mixing method. The conductive material 21 may have the form of a nanowire, a nanorod, a nanosphere, or a nanoring. The conductive material 21 may include at least one among nickel (Ni), cobalt (Co), iron (Fe), platinum (Pt), gold (Au), silver (Ag), aluminum (Al), chrome (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), zirconium (Zr), germanium (Ge), and alloys thereof. Moreover, conductive material 21 may include conducting polymer material. The insulating material 22 may include at least one among polyester, polycarbonate, polyvinyl alcohol, polyvinyl butyral, polyacetal, polyarylate, polyamide, polyamide-imide, polyetherimide, polyphenylenether, polyphenylene sulfide, polyethersulfone, polyetherketone, polypthalamide, polyether nitrile, polyethersulofone, polybenzimidazole, polycarbodiimide, polysiloxane, polymethylmethacrylate, polymethacrylamide, nitrile rubber, acryl rubber, polyethylene tetrafluoride, epoxy resin, phenol resin, melamine resin, urea resin, polybutene, polypentene, ethylene-co-propylene, ethylene-co-butenediene, polybutadiene, polyisoprene, ethylene-co-propylenediene, butyl rubber, polymethylpentene, polystyrene, styrene-co-butadiene, hydrogenated styrene-co-butadiene, hydrogenated polyisoprene, hydrogenated polybutadiene. Moreover, the insulating material 22 may not only be a homopolymer, but also a copolymer in which two or more types of monomers are polymerized, a graft polymer, or another known insulating polymer material.

The first solvent 31 may be at least one among an aliphatic hydrocarbon solvent such as hexane or heptane; an aromatic hydrocarbon solvent such as toluene, pyridine, quinoline, anisole, mesitylene, or xylene; a ketone-based solvent such as cyclohexanone, methyl ethyl ketone, 4-heptanone, methyl isobutyl ketone, 1-methyl-2-pyrrolidinone, cyclohexanone, or acetone; an ether-based solvent such as tetrahydrofuran or isopropyl ether; an acetate-based solvent such as ethyl acetate, butyl acetate, or propylene glycol methyl ether acetate; an amide-based solvent such as dimethylacetamide or dimethylformamide; a silicon-based solvent; and mixtures of such solvents. Moreover, the first solvent 31 may be one of the materials displayed in Table 1. The second solvent 32 may include one of the solvents provided as examples of the first solvent 31. However, the second solvent 32 may also include a different material from the first solvent 31. Specifically, the second solvent 32 may have a different polarity from, or be immiscible with, the first solvent 31.

TABLE 1

| Material | Polarity |
| --- | --- |
| Toluene [C6H5CH3] | Non-polar |
| Hydrocarbon ex) [C6H6], Benzene | ↑ |
| Alkylhalide ex) [CHCl3] | |
| Ether ex) [CH3CH2OCH2CH3], diethylether, (CH2)4O, tetrahydrofuran (THF) | |
| Ketone ex) [CH3C(O)CH3] = ester [RCO(O)R, CH3CO(O)CH2CH3, ethyl acetate = carboxylic acid [acetic acid, CH3COOH] | |
| Alcohol ex) [CH3CH2OH], ethanol, [(CH3)2CHOH], isopropyl alcohol (IPA) | |
| Water H2O | |
| [RC(O)NR2] ex) [(CH3)2NC(O)H] Dimethyl formamide (DMF) | ↓ |
| [RS(O)R] ex) [CH3SOCH3] [Dimethyl sulfoxide (DMSO) | Polar |

FIGS. 3 to 6 are cross-sectional views for illustrating a method for manufacturing an electronic element including a transparent conductive structure according to an embodiment of the inventive concept.

Figure 3:
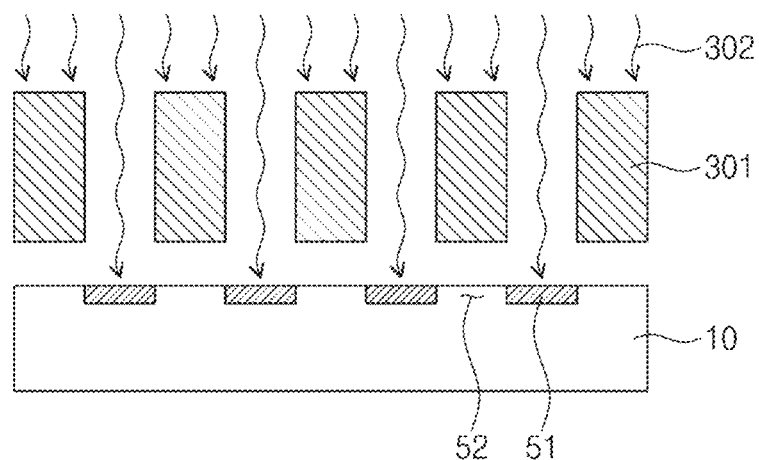
FIGS. 3 to 6 are cross-sectional views for illustrating a method for manufacturing an electronic element including a transparent conductive structure according to an embodiment of the inventive concept.

Referring to FIGS. 1 and 3, a portion of the surface of a transparent electrode 10 may be selectively modified S20.

The transparent electrode 10 is formed inside of the display device and may be a conductor having optical transmittance and used as a cathode electrode and/or an anode electrode. The material used for the transparent electrode 10 may be indium tin oxide (ITO), or a metal oxide such as indium zinc oxide (IZO), indium gallium zinc oxide (IGZO), or zinc oxide (ZnO).

A mask 301 may be positioned on the transparent electrode 10. Here, the surface of the transparent electrode 10 may include a first region 51 which is exposed by an opening in the mask 301 and a second region 52 which is covered by the mask 301. The first region 51 exposed by the opening may be surface-modified to be hydrophilic or hydrophobic. A plasma treatment, an ozone treatment, irradiation with ultraviolet radiation, or a self assembled monolayer (SAM) technique and the like may be utilized for the surface modification.

The surface-modified first region 51 may have a higher degree of wetting with the first solvent 31 than with the second solvent 32. The degree of wetting may be obtained by measuring the contact angle (degrees) formed when each of the first solvent 31 and the second solvent 32 are dropped on the first region 51. For example, the degree of wetting may be defined using the Owens-Wendt-geometric mean and Young's equation.

According to an embodiment, when the first solvent 31 is polar, the first region 51 may be hydrophilic ally modified. In another embodiment, when the first solvent 31 is non-polar, the first region 51 may be hydrophobically modified.

When surface modification is performed using the plasma treatment, a surface modifying agent 302 may be utilized. The surface modifying agent 302 may be nitrogen, oxygen, an inert gas, carbon dioxide, nitrogen oxide, a perfluorinated gas, hydrogen, ammonia, a chlorine-based gas, ozone, or a mixture thereof. The inert gas may be, for example, helium, argon, neon, or xenon. The perfluorinated gas may be, for example, tetrafluoromethane ($CF_4$), hexafluoroethane ($C_2F_6$), $CF_3CF=CF_2$, chlorotrifluoromethane ($CClF_3$), or sulfur hexafluoride ($SF_6$).

The surface modifying agent 302 may be selected such that the modified first region 51 has a higher surface energy than the unmodified second region 52. For example, after being surface-modified by exposure to a plasma for 15 seconds under 180 W power conditions while 30 sccm and 15 sccm respectively of argon and oxygen are supplied, a silicon substrate may have a surface energy that is about 26 $mJ/m^2$ higher than prior to the surface modification, and a glass substrate may have a surface energy that is about 28 $mJ/m^2$ higher than prior to the surface modification. The surface energy may be obtained by measuring the contact angle (degrees) formed when each of a polar solution and a non-polar solution are dropped on the transparent electrode. For example, the surface energy may be defined using the Owens-Wendt-geometric mean and Young's equation.

Figure 4:
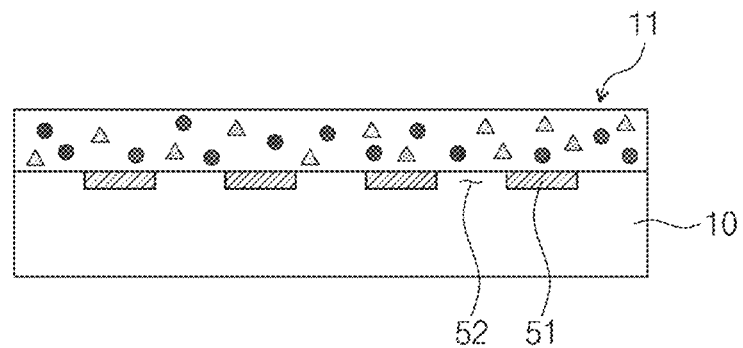

Referring to FIGS. 1 and 4, a mixed composition 11 may be applied onto the surface of the surface-modified transparent electrode 10 S30. Specifically, a printing, doctor blading, or spin coating technique may be utilized as a method for applying the mixed composition 11 onto the surface of the transparent electrode 10.

Figure 5:
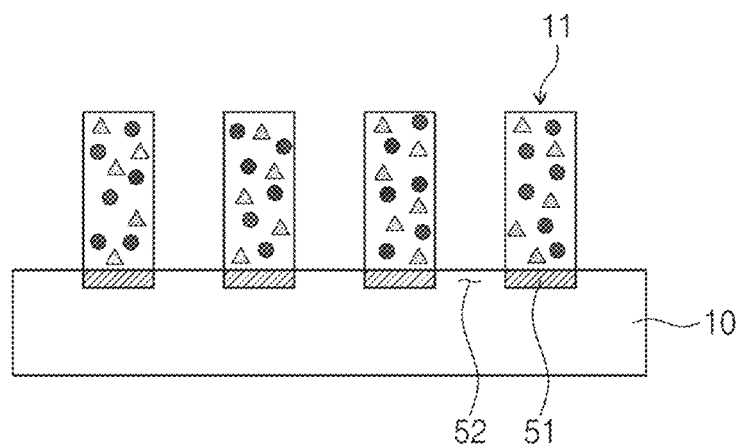

Referring to FIG. 5, the applied mixed composition 11 may be selectively positioned on the first region 51 due to the surface energy difference and surface tension between the first region 51 and the second region 52.

Figure 6:
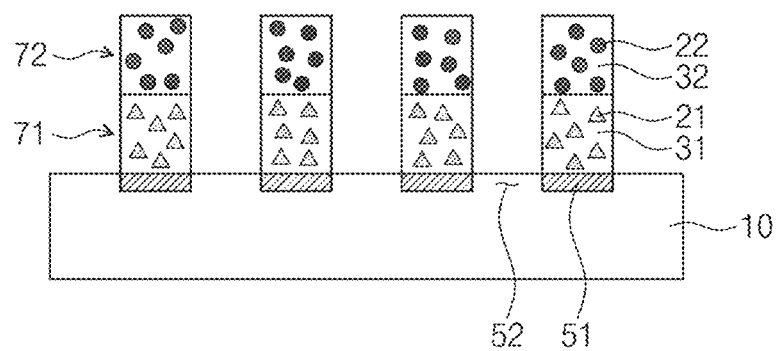

Referring to FIGS. 1 and 6, the applied mixed composition 11 may undergo phase separation due to a polarity difference S40. The applied mixed composition 11 may be phase-separated into a first composition layer 71 and a second composition layer 72 due to the polarity difference between the first solvent 31 and the second solvent 32. Herein, phase separation may indicate the separation of compositions having different properties from each other.

The first composition layer 71 may be formed on the first region 51. Specifically, the first solvent 31 having the same polarity as the first region 51 may move to the surface of the first region 51 and form the first composition layer 71. Here, the movement of the first solvent 31 may cause the conductive material 21 dispersed or dissolved in the first solvent 31 to be located inside the first composition layer 71

The second composition layer 72 may be formed on the first composition layer 71. Specifically, the movement of the first solvent 31 to the first region 51 may cause the second solvent 32 to move onto the first solvent 31 and form the second composition layer 72. Here, the movement of the second solvent 32 may cause the insulating material 22 dispersed or dissolved in the second solvent 32 to be located inside the second composition layer 72. The phase separation may proceed spontaneously after the application of the mixed composition, without a separate process. In contrast, an additional process such as a heat treatment may be included.

Figure 7A:
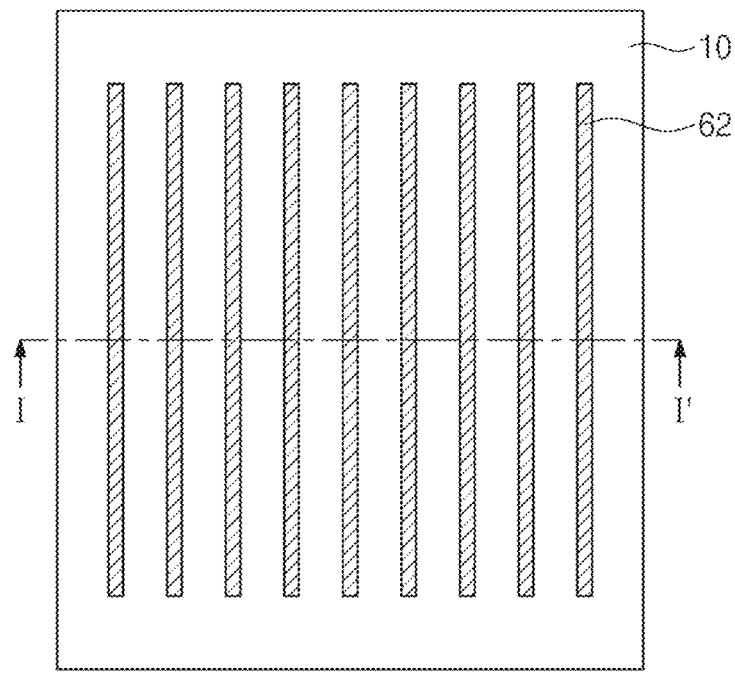
FIG. 7A is a plan view illustrating a transparent conductive structure according to an embodiment of the inventive concept.
Figure 7B:
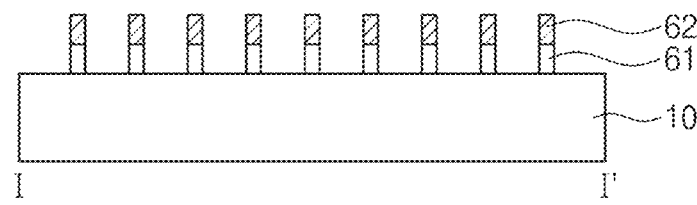
FIG. 7B is a cross-sectional view along I-I'.

FIG. 7A is a plan view illustrating a conductive layer and an insulating layer formed on a transparent electrode according to an embodiment of the inventive concept, and FIG. 7B is a cross-sectional view along I-I'.

Referring to FIGS. 1, 7A, and 7B, the first composition layer and the second composition layer formed via phase separation may be cured S50. A conductive layer 61 including the conductive material 21 may be formed by curing the first composition layer 71. An insulating layer 62 including the insulating material may be formed by curing the second composition layer 72.

Specifically, a method for curing the first composition layer 71 and the second composition layer 72 may be a thermal curing technique or a UV curing technique. According to the thermal curing technique, the conductive layer 71 and the insulating layer 72 may be formed by heat treating the first composition layer 71 and the second composition layer 72 at a temperature range of about 150 to 180 degrees for about 30 minutes to an hour. Afterwards, a second heat treating operation in which the temperature is increased to about 350 to 550 degrees for about 30 minutes to an hour may be performed to form the conductive layer 61 and the insulating layer 62 which are dense. Such a heat treatment may be performed under normal atmospheric pressure. According to the UV curing technique, the first composition layer 71 and the second composition layer 72 may be heat treated at a temperature range of about 150 to 180 degrees for about 30 minutes to an hour. Then, the conductive layer 61 and the insulating layer 62 may be formed by exposure to UV radiation. After the curing reaction, a second heat treating operation may be further performed at about 200 to 250 degrees for about 30 minutes to an hour to form the conductive layer 61 and the insulating layer 62 which are dense.

The curing of the first composition layer 71 to form the conductive layer 61 and the curing of the second composition layer 72 to form the insulating layer 62 may be performed concurrently. The phase separation S40 and the curing S50 may be performed concurrently. For example, when the mixed composition 11 is phase-separated by a heat treating operation, the phase separation S40 and the curing S50 may not be clearly distinguished. A transparent conductive structure may be manufactured by a process according to above embodiments of the inventive concept.

Experimental Example

A first composition was prepared by dispersing silver nanowires in a polar isopropyl alcohol (($CH_3$)$_2$CHOH). A second composition was prepared by dispersing dust particles used for identification in a non-polar toluene (C6H5CH3) having 5% of polystyrene dissolved therein. A mixed composition was prepared by physically mixing the first composition and the second composition. A shadow mask was positioned on a transparent electrode, and oxygen plasma was utilized to selectively modify the surface of the transparent electrode. A first region surface-modified to be hydrophilic and a second region which did not undergo surface modification were formed. The mixed composition was applied onto the surface-modified transparent electrode. The applied mixed composition was selectively located in the first region due to the surface energy difference between the first region and the second region. The isopropyl alcohol ((CH3)2CHOH) included in the first composition was polar, and thus moved to the surface of the hydrophilic first region to form a first composition layer. The silver nanowires dispersed inside the isopropyl alcohol ((CH3)2CHOH) moved along with the isopropyl alcohol ((CH3)2CHOH), and were thus located inside the first composition layer. The polystyrene-containing toluene (C6H5CH3) lacked mutual solubility with the isopropyl alcohol, and thus moved above the isopropyl alcohol to form a second composition layer. The dust particles for identification dispersed in the toluene moved along with the toluene, and were thus located inside the second composition layer. A conductive layer and an insulating layer were formed by heat treating the first composition layer and the second composition layer.

Figure 8A:
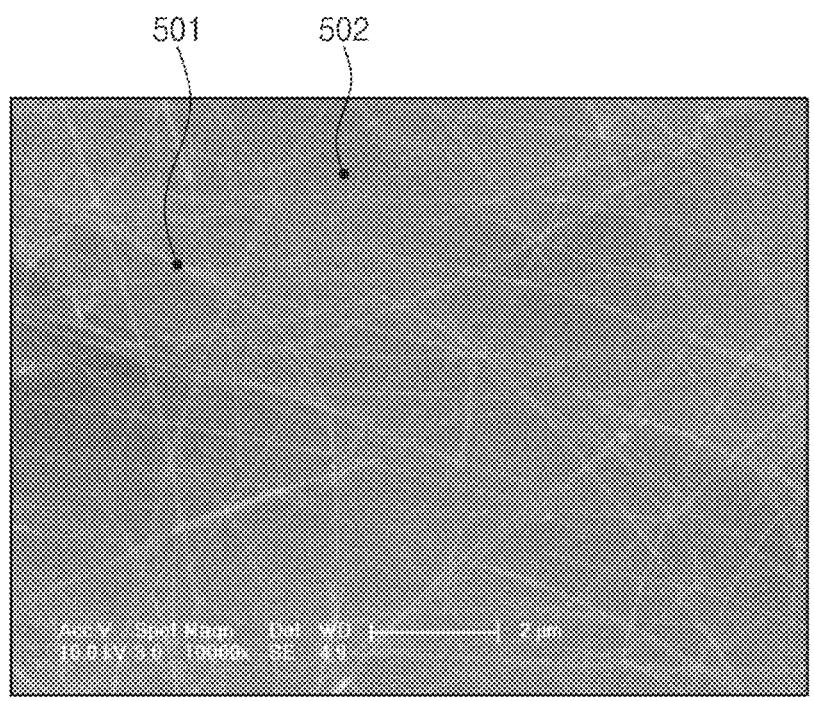
FIGS. 8A, 8B, and 8C are scanning electron micrographs showing the surface properties of a transparent electrode structure according to an embodiment of the inventive concept.
Figure 8B:
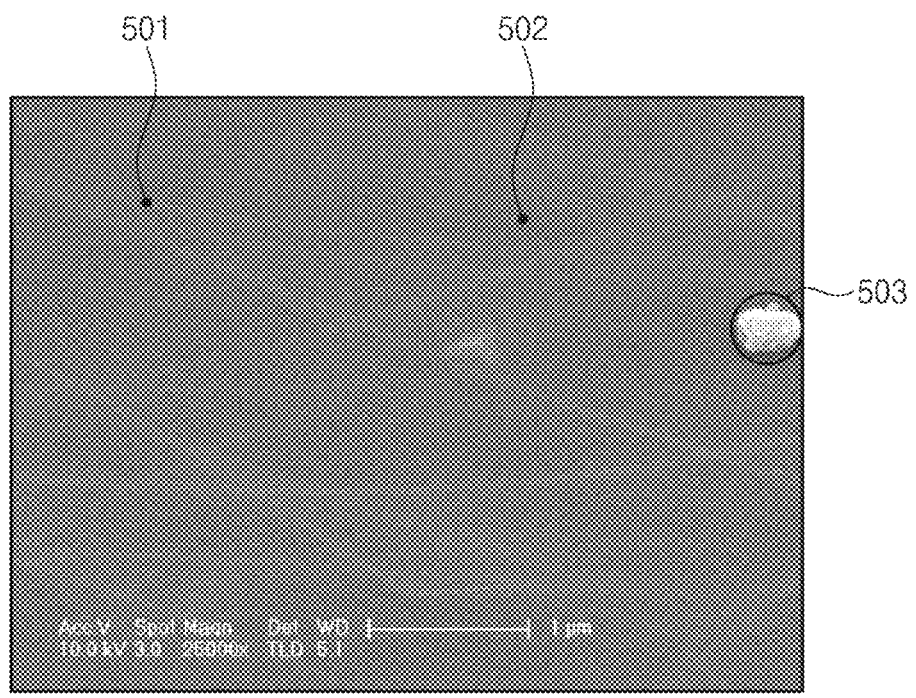
Figure 8C:
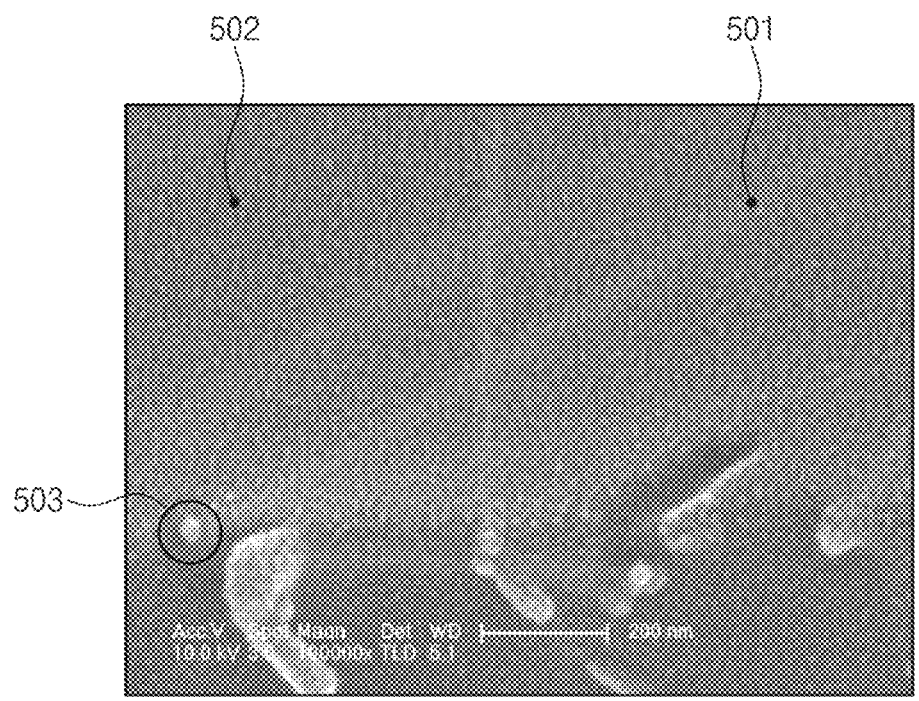

The silver nanowires 501, the polystyrene 502, and the dust particles for identification 503 may be observed by looking at the scanning electron micrograph in FIG. 8A, which is an expanded view of the first region. FIGS. 8B and 8C, which are expanded view of FIG. 8A, show that the silver nanowires 501 are located below the dust particles used for identification 503. Thus, it may be seen that the conductive layer was formed below and the insulating layer was formed above.

A transparent conductive structure according to embodiments of the inventive concept may be used in electronic elements, such as touch panels or organic light emitting elements, in which transparent electrodes are used. For example, when the electronic element including the transparent conductive structure according to embodiments of the inventive concept is an organic light emitting element, a preparation method for an organic light emitting element using the same may form a conductive layer and an insulating layer on a transparent electrode without expensive vacuum deposition and photolithography processes. Moreover, damage to the conductive layer which occurs during an etching process may be prevented.

Figure 9A:
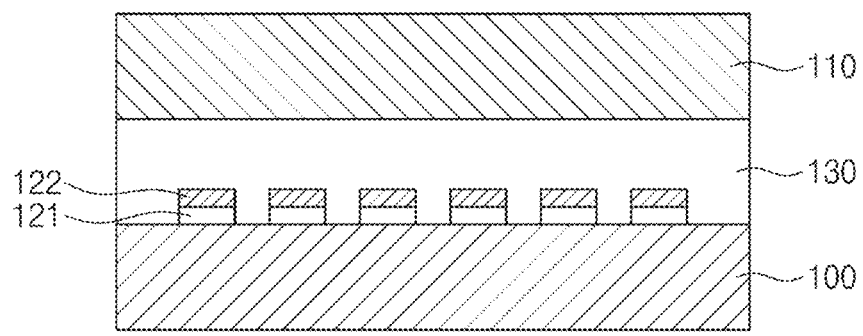
FIGS. 9A and 9B are cross-sectional views of an organic light emitting element manufactured according to an embodiment of the inventive concept.
Figure 9B:
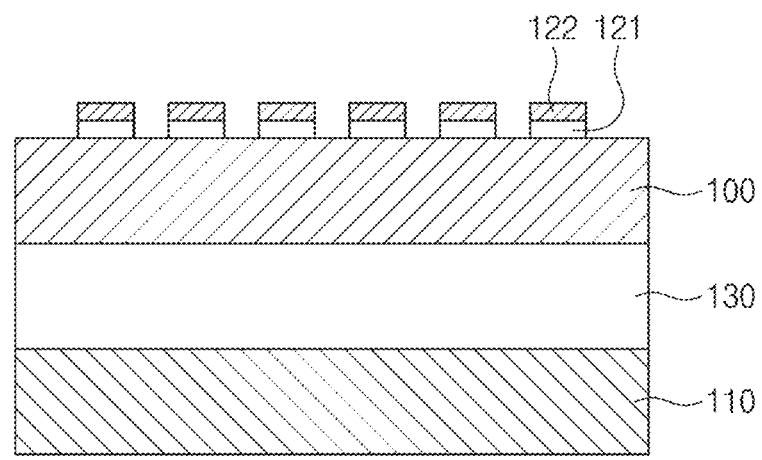

FIGS. 9A and 9B are cross-sectional views of an organic light emitting element manufactured according to an embodiment of the inventive concept.

An organic light emitting element may be manufactured by referring to FIGS. 9A and 9B. A first electrode 100 may be prepared. A conductive layer 121 and an insulating layer 122 may be formed on the first electrode 100. A method for forming the conductive layer 121 and the insulating layer 122 on the first electrode 100 may be identical to the method for manufacturing a transparent conductive structure. An organic light emitting layer 130 may be formed on a face of the first electrode 100 including the conductive layer 121 and the insulating layer 122. A second electrode 110 may be formed on the organic light emitting layer 130. The organic light emitting layer 130 may be positioned between the first electrode 100 and the second electrode 110. For example, the conductive layer 121 and the conductive layer 122 may be disposed inside of the organic light emitting layer 130, as in FIG. 9A. In another example, the conductive layer 121 and the insulating layer 122 may be spaced apart from the organic light emitting layer 130 with the first electrode therebetween 100, as in FIG. 9B.

According to an embodiment, the first electrode 100 may be one among a cathode electrode, which supplies electrons to the organic light emitting layer 130, and an anode electrode, which supplies holes to the organic light emitting layer 130. The second electrode 110 may be the other one among the cathode electrode, which supplies electrons to the organic light emitting layer 130, and the anode electrode, which supplies holes to the organic light emitting layer.

The organic light emitting element may include an electron injection layer (EIL), an electron transport layer (ETL), a hole injection layer (HIL), and a hole transport layer (HTL), which facilitate the injection and transport of electrons or holes.

In the organic light emitting element, the holes introduced from the anode electrode and the electrons introduced from the cathode electrode may be recombined after reaching the organic light emitting layer via hopping. The recombined electrons and holes may be rearranged by electrostatic attraction and thereby form excitons. Energy generated as the excitons produced inside the organic light emitting layer fall to the ground state may cause self-light emission by the organic light emitting layer.

A method for manufacturing an electronic element including a transparent conductive structure according to embodiments of the inventive concept may form a conductive layer and an insulating layer on the surface of a transparent electrode without expensive vacuum deposition and photolithography processes. Moreover, damage to the conductive layer during an etching process may be prevented.

Although the exemplary embodiments of the present invention have been described, it is understood that the present invention should not be limited to these exemplary embodiments but may be realized in other specific forms by one ordinarily skilled in the art, without changing the technical concepts or essential features of the invention. Thus, it is to be understood that the embodiments described above are not limiting, but rather, are in every way exemplary.

What is claimed is:

1. A method for manufacturing an electronic device including a transparent conductive structure, the method comprising:

preparing a transparent electrode including a first region and a second region, the first region being selectively surface-modified;

preparing a mixed composition including a first composition and a second composition having a different polarity from the first composition, the first composition including a conductive material, the second composition including an insulating material; and applying the mixed composition onto the transparent electrode, wherein the applied mixed composition is disposed in the surface modified first region, wherein the mixed composition disposed in the first region is phase-separated into a first composition layer and a second composition layer disposed on a top surface of the first composition layer, the first composition layer being a conductive layer and the second composition layer being an insulating layer, and wherein when the mixed composition is phase-separated, the second composition layer is formed so as to be disposed on the first composition layer based on the mixed composition interacting with the selectively surface-modified transparent electrode.

2. The method of claim 1, wherein the preparation of the transparent electrode comprises:
   placing on the transparent electrode a mask having an opening formed therein, the mask being placed so as to cover the second region; and
   forming the first region by modifying the surface of the transparent electrode exposed by the opening of the mask.

3. The method of claim 2, wherein the modification of the surface of the transparent electrode comprises at least one of a plasma treatment, an ozone treatment, irradiation with ultraviolet radiation, or a self assembled monolayer (SAM) technique.

4. The method of claim 2, wherein the modification of the surface of the transparent electrode comprises performing a plasma treatment using a surface modifying agent, the surface modifying agent including at least one of nitrogen, oxygen, an inert gas, carbon dioxide, nitrogen oxide, hydrogen, ammonia, a chlorine-based gas, ozone, helium, argon, neon, xenon, a perfluorinated gas, or a mixture thereof.

5. The method of claim 2, wherein the first region has a higher surface energy than the second region.

6. The method of claim 2, wherein the first region has a higher degree of wetting with the first composition than with the second composition.

7. The method of claim 1, wherein the mixed composition is a physical mixture of the first composition and the second composition.

8. The method of claim 7, wherein:
   the first composition includes the conductive material and a first solvent; and
   the second composition includes the insulating material and a second solvent.

9. The method of claim 8, wherein the conductive material has the form of at least one of a nanowire, a nanorod, a nanosphere, or a nanoring.

10. The method of claim 8, wherein the first solvent and the second solvent have different polarities from each other.

11. The method of claim 1, further comprising performing a heat treatment operation or a UV exposure operation after the application of the mixed composition.

12. The method of claim 1, further comprising curing the phase-separated first and second composition layers.

13. The method of claim 1, further comprising:
   forming an organic light emitting layer on a face of the transparent electrode; and
   forming an additional electrode on the organic light emitting layer, wherein the organic light emitting layer is positioned between the transparent electrode and the additional electrode.

* * * * *